(12) United States Patent
Song (10) Patent No.: US 8,395,957 B2
(45) Date of Patent: Mar. 12, 2013

(54) CIRCUIT AND METHOD FOR CONTROLLING SELF-REFRESH OPERATION IN SEMICONDUCTOR MEMORY DEVICE

(75) Inventor: Choung-Ki Song, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 137 days.

(21) Appl. No.: 12/908,279

(22) Filed: Oct. 20, 2010

(65) Prior Publication Data

US 2012/0051168 A1 Mar. 1, 2012

(30) Foreign Application Priority Data

Aug. 30, 2010 (KR) .................. 10-2010-0083862

(51) Int. Cl.
*G11C 7/00* (2006.01)

(52) U.S. Cl. .................. 365/222; 365/195; 365/230.03; 365/230.08

(58) Field of Classification Search .................. 365/222, 365/230.03, 230.08, 195
See application file for complete search history.

(56) References Cited

U.S. PATENT DOCUMENTS

| 6,518,595 | B2 * | 2/2003 | Lee | 257/66 |
| 6,549,479 | B2 * | 4/2003 | Blodgett | 365/222 |
| 6,590,822 | B2 * | 7/2003 | Hwang et al. | 365/222 |
| 6,819,617 | B2 * | 11/2004 | Hwang et al. | 365/222 |
| 7,088,635 | B2 * | 8/2006 | Hur et al. | 365/222 |
| 7,158,434 | B2 * | 1/2007 | Hokenmaier | 365/222 |
| 2005/0041506 | A1 * | 2/2005 | Hwang et al. | 365/222 |

FOREIGN PATENT DOCUMENTS

| JP | 2001-332084 | 11/2001 |
| KR | 1020020085758 | 11/2002 |
| KR | 1020060053426 | 5/2006 |
| KR | 1020090044414 | 5/2009 |

OTHER PUBLICATIONS

Office Action issued by the Korean Intellectual Property Office on Feb. 9, 2012.
Notice of Allowance issued by the Korean Intellectual Property Office on Aug. 29, 2012.

\* cited by examiner

*Primary Examiner* — Pho M Luu
(74) *Attorney, Agent, or Firm* — IP & T Group LLP (57) ABSTRACT

A self-refresh control circuit includes: a code generator configured to generate a code by counting periods of a periodic wave based on a self-refresh signal and reset when a code value of the generated code reaches a first value; a bank active signal generator configured to generate a plurality of bank active signals activated in response to different code values of the generated code, respectively, by decoding the generated code; and an address generator configured to change a row address after the plurality of bank active signals are each activated after the reset of the code generator.

20 Claims, 8 Drawing Sheets

CIRCUIT AND METHOD FOR CONTROLLING SELF-REFRESH OPERATION IN SEMICONDUCTOR MEMORY DEVICE

CROSS-REFERENCE TO RELATED APPLICATIONS

The present application claims priority of Korean Patent Application No. 10-2010-0083862, filed on Aug. 30, 2010, which is incorporated herein by reference in its entirety.

BACKGROUND OF THE INVENTION

Exemplary embodiments of the present invention relate to a self-refresh control circuit for distributing current consumption during a self-refresh operation in a semiconductor memory device, and a control method thereof.

Unlike Static Random Access Memory (SRAM) or flash memory, a Dynamic Random Access Memory (DRAM) device loses data stored in its memory cells over time. This is because a memory cell of a DRAM device typically includes a transistor and a capacitor, where charge for stored data in the capacitor is discharged over time. Thus, a refresh operation for refreshing data stored in memory cells at desired periods is performed to prevent data loss. In performing a refresh operation, during the retention time of each memory cell of a memory bank, a refresh operation is performed at least once by activating a word line into an active state and amplifying data. Herein, the retention time of a memory cell is a time that data of a memory cell can be maintained without a refresh operation after the initial data storage.

In performing a refresh operation, an auto-refresh mode and/or a self-refresh mode may be used. The auto-refresh mode is a mode where a refresh operation is performed by an applied command in a system including a DRAM device, and the self-refresh mode is a mode where a DRAM device performs the refresh operation by itself when a system is not operated for a certain time.

Figure 1:
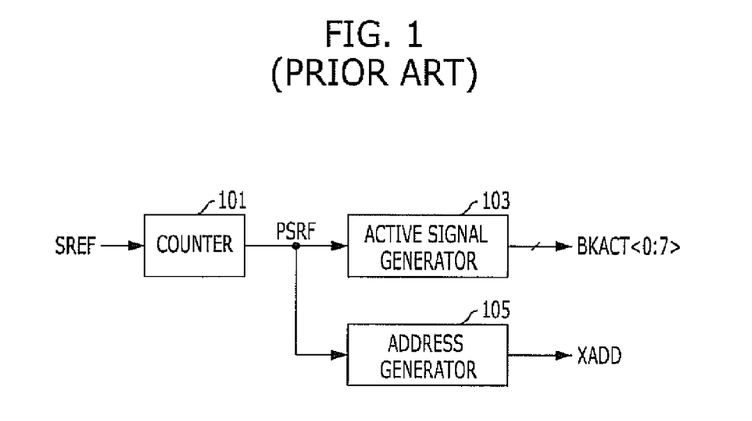
FIG. 1 is a block diagram of a conventional self-refresh control circuit.
Figure 2:
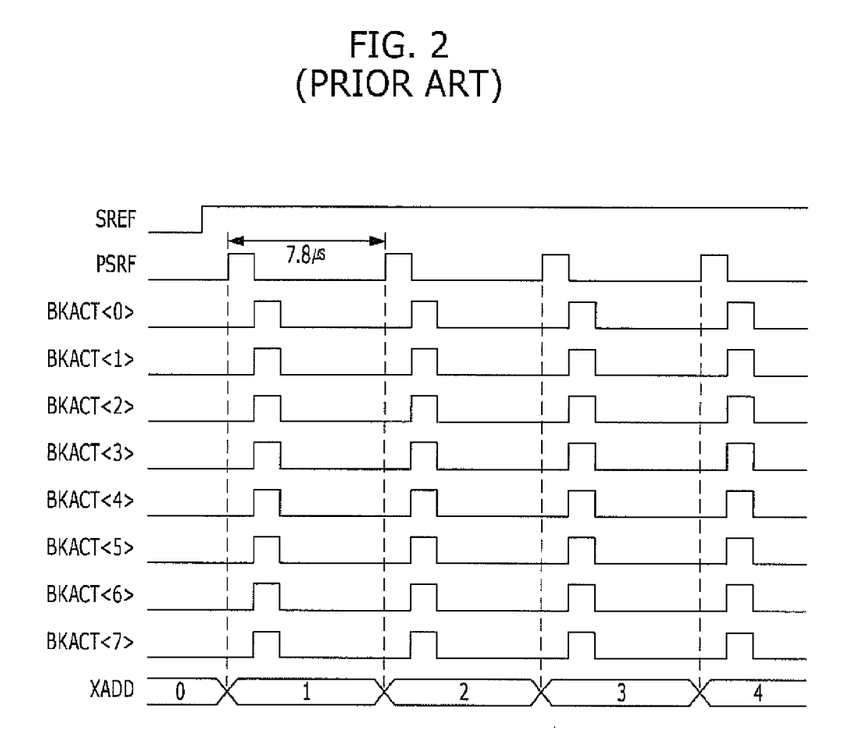
FIG. 2 is a timing diagram of internal signals of the self-refresh control circuit shown in FIG. 1.

FIG. 1 is a block diagram of a conventional self-refresh control circuit, and FIG. 2 is a timing diagram of internal signals of the self-refresh control circuit shown in FIG. 1.

Referring to FIG. 1, the conventional self-refresh control circuit includes a counter 101, an active signal generator 103, and an address generator 105.

The counter 101 periodically generates a refresh pulse PSRF when a self-refresh signal SREF is activated. Herein, the self-refresh signal SREF is a signal activated to a logic high level in a self-refresh mode duration of a DRAM device. According to an example, the period when the refresh pulse PSRF is generated may be 7.8 μs.

The active signal generator 103 generates a bank active signal BKACT<0:7> for activating banks (not shown) of a core region into an active state, when the refresh pulse PSRF is applied. Here, according to an example, the core region includes 8 banks.

The address generator 105 generates a row address XADD to activate a word line of each bank, and when the refresh pulse PSRF is applied, the address generator 105 sequentially increases the row address XADD so as to activate all word lines in the bank sequentially.

However, as illustrated in FIG. 2, since the self-refresh operation simultaneously activates a plurality of banks each of which includes a plurality of memory cells, high-peak current is generated. When a system performs the refresh operation for each bank in the auto-refresh mode, peak current of a system may be controllable to some extent. In the self-refresh mode, however, where the refresh operation is performed by an internal oscillator, all DRAM devices in a module may simultaneously perform a refresh operation, where the amount of instant current consumption may be several times that of the auto-refresh mode. Since Double Data Rate Three Synchronous dynamic Random Access Memory (DDR3) devices and DDR4 devices are supplied with low external voltages, power consumption in the self-refresh operation may exceed that allowed under the applied external voltages and thus render the refresh operation to be unstable.

SUMMARY OF THE INVENTION

An exemplary embodiment of the present invention are directed to a self-refresh control circuit which contributes to stable refresh operation by distributing peak current consumption in a self-refresh operation, and a control method thereof.

In accordance with an embodiment of the present invention, a self-refresh control circuit includes: a code generator configured to generate a code by counting periods of a periodic wave based on a self-refresh signal and reset when a code value of the generated code reaches a first value; a bank active signal generator configured to generate a plurality of bank active signals activated in response to different code values of the generated code, respectively, by decoding the generated code; and an address generator configured to change a row address after the plurality of the bank active signals are each activated after the reset of the code generator.

The code generator may include: an oscillation unit for receiving the self-refresh signal to generate the periodic wave which toggles at a first period; and a counting unit for generating the code which corresponds to a counting result of counting the periods of the periodic wave, and resetting the code value of the generated code to an initial value when the code value reaches the first value.

Where N is a natural number, the plurality of bank active signals include N bank active signals, the bank active signal generator may activate the N bank active signals respectively corresponding to N different code values of the generated code. The N bank active signals may be each activated when a respective one of the N different code values is generated.

In accordance with another embodiment of the present invention, a semiconductor memory device includes: a code generator configured to generate a code by counting periods of a periodic wave based on a self-refresh signal and be initialized when a code value of the generated code reaches a predetermined value; a bank active signal generator configured to generate a plurality of bank active signals activated in response to different code values of the generated code, respectively, by decoding the generated code; an address generator configured to change a row address after the plurality of the bank active signals are each activated after the reset of the code generator; and a plurality of banks configured to perform a refresh operation in response to the plurality of the bank active signals and the row address.

In accordance with another embodiment of the present invention, a method for controlling a self-refresh operation includes: generating a code by counting periods of a periodic wave based on a self-refresh signal; resetting a code value of the generated code when the code value reaches a first value; generating a plurality of bank active signals activated in response to different code values of the generated code, respectively, by decoding the generated code; and changing a row address after the plurality of the bank active signals are each activated after the reset of the code value.

DESCRIPTION OF SPECIFIC EMBODIMENTS

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 3:
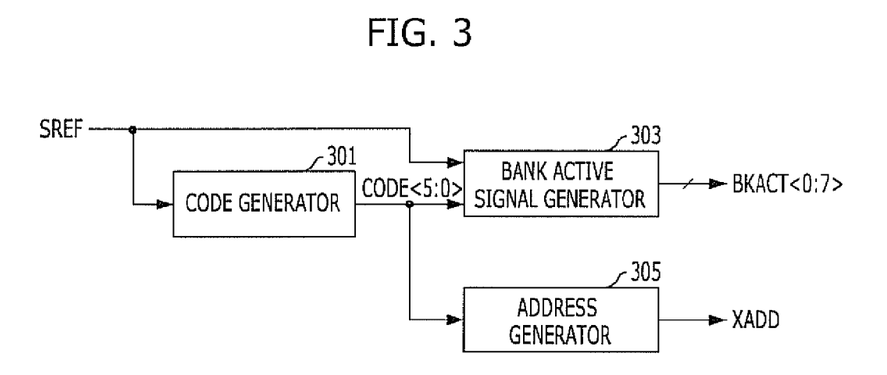
FIG. 3 is a block diagram of a self-refresh control circuit in accordance with an embodiment of the present invention.

FIG. 3 is a block diagram of a self-refresh control circuit in accordance with an embodiment of the present invention.

Referring to FIG. 3, the self-refresh control circuit includes a code generator 301, a bank active signal generator 303, and an address generator 305. The code generator 301 generates a code CODE<5:0> by counting a periodic wave OSC (not shown) based on a self-refresh signal SREF, and is initialized when a code value CODE_V (not shown) of the code CODE<5:0> reaches a certain value, the code generator 301. The bank active signal generator 303 generates a plurality of bank active signals BKACT<0:7> which are activated at a different code value CODE_V by decoding the code CODE<5:0>. The address generator 305 changes a row address XADD when each of the plurality of the bank active signals BKACT<0:7> has been activated after a reset.

The code generator 301 counts the periodic wave OSC and generates the code CODE<5:0>, when the self-refresh signal SREF is activated to a logic high level. Herein, the self-refresh signal SREF is a signal activated to a logic high level in a self-refresh mode duration of a semiconductor memory device. The code CODE<5:0> is a six-digit binary number indicating a result of counting the periodic wave OSC, and the code value CODE_V is a decimal value indicating a counting result. For example, when the counting result is 3, the code CODE<5:0> is 000011, and the code value CODE_V is 3. According to an exemplary embodiment, the code generator 301 generates at each period a total of 39 codes ranging from 000000 to 100110 after 38 counting steps starting from an initial value 0 to 38 and initializes the count value back to 0. Hereafter, the embodiment of the present invention is described with reference to FIGS. 4 to 6.

The bank active signal generator 303 receives a generated 1.0 code CODE<5:0>, and activates the plurality of bank active signals BKACT<0:7> corresponding to different code values CODE_V to logic high levels by decoding the received code CODE<5:0>. Current consumption in a refresh operation duration is distributed by enabling the plurality of the bank active signals BKACT<0:7> at different times based on the code CODE<5:0>, which is the result of counting the periodic wave OSC by the code generator 301. As a result, large peak current is prevented/reduced. Hereafter, the embodiment of the present invention is described with reference to FIG. 7.

The address generator 305 generates the row address XADD for selecting a word line to perform a refresh operation, where the address generator 305 may sequentially activate each of the different row addresses XADD so that the bank active signals BKACT<0:7> are each to activated for corresponding word lines of the banks sequentially while the particular row address XADD is activated. Here, a different row address XADD is not activated until all of the bank active signals BKACT<0:7> are each activated for the previous row address.

Figure 4:
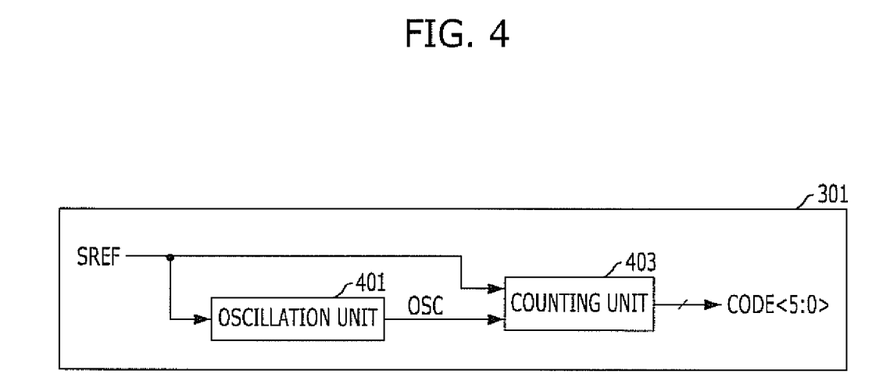
FIG. 4 is a block diagram of a code generator shown in FIG. 3.

FIG. 4 is a block diagram of the code generator 301 shown in FIG. 3.

Referring to FIG. 4, the code generator 301 includes an oscillation unit 401 and a counting unit 403. The oscillation unit 401 receives the self-refresh signal SREF to generate the periodic wave OSC which toggles at a certain period. The oscillation unit 401 may have a form of a ring oscillator including an inverter chain where a plurality of inverters are serially connected. According to an example, the period of toggling is approximately 200 ns, where a high duration and a low duration in the period are each 100 ns.

The counting unit 403 counts up the number of toggles of the periodic wave starting from the initial value 0, and generates the code CODE<5:0> corresponding to the counting result. Thus, each time that the periodic wave OSC is toggled, the code value CODE_V increases by one. When the code value CODE_V reaches a certain value (for example, 38), the counting unit 403 resets the code value CODE_V to 0. Therefore, after the periodic wave toggles 39 times after the counting unit 403 is reset to output the code value CODE_V of 0, the counting unit 403 is initialized/reset again. Here, since a period of the periodic wave is approximately 200 ns, the counting unit 403 is initialized once every 7.8 μs. The initialization cycle determines a time interval that each of the bank active signals BKACT<0:7> is periodically activated. As an example, the period activation for bank active signal BKACT<0> in the self-refresh mode is 7.8 μs.

Figure 5:
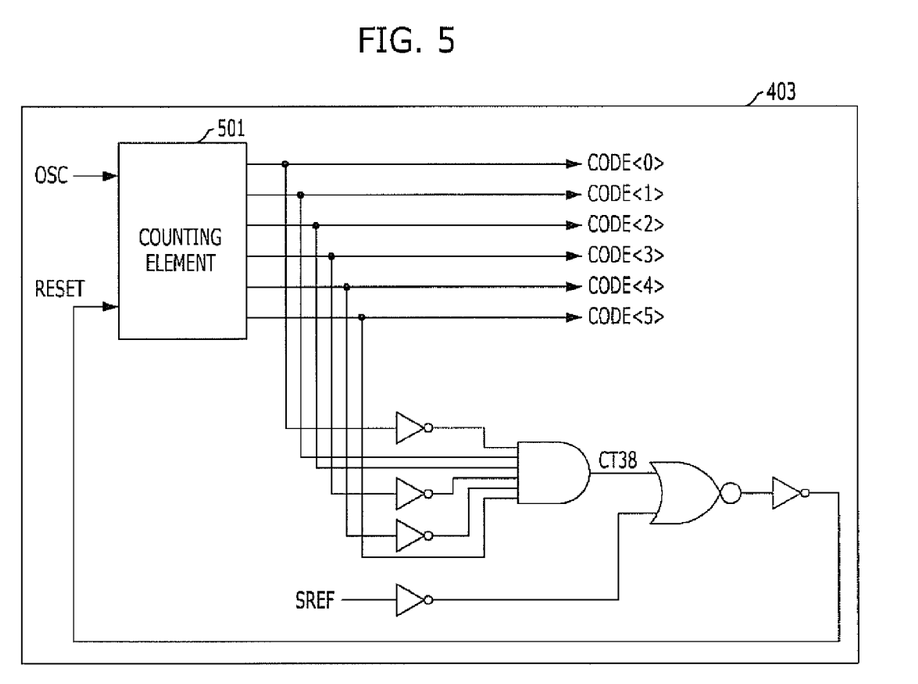
FIG. 5 is an internal circuit diagram of a counter shown in FIG. 4.
Figure 6:
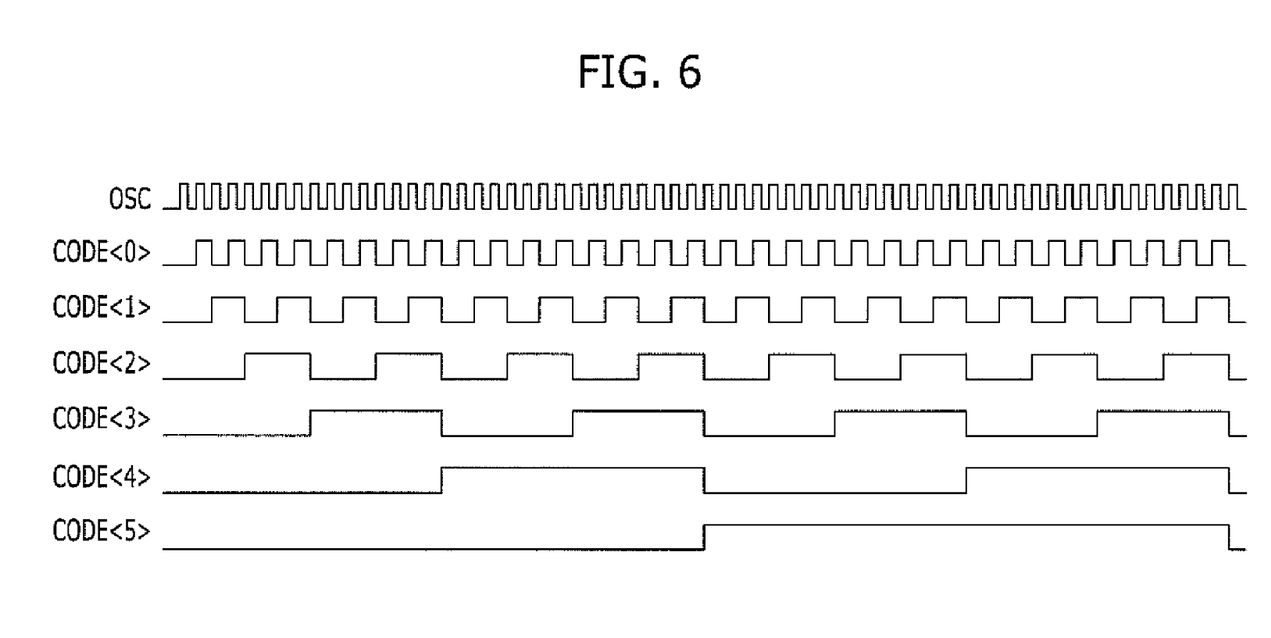
FIG. 6 shows waveform of a code CODE<5:0> generated in the counter 403 of FIG. 4.

FIG. 5 is an internal circuit diagram of the counter 403 shown in FIG. 4, and FIG. 6 shows a waveform of the code CODE<5:0> generated in the counter 403 of FIG. 4.

Referring to FIG. 5, a counting element 501 in the counting unit 403 counts the inputted periodic wave OSC and outputs the code CODE<0:5>, i.e., CODE<0> to CODE<5> having the waveforms shown in FIG. 6. A first code CODE<0> is the first digit number, which is the least significant bit (LSB), of the six-digit code CODE<5:0>, and a second code CODE<1> is the second digit number. A third code CODE<2> is the third digit number, and a fourth code CODE<3> is the fourth digit number. A fifth code CODE<4> becomes the fifth digit number, and a sixth code CODE<5> becomes the sixth digit number, which is the most significant bit (MSB). The first to sixth codes CODE<0> to CODE<5> together at any given time constitute a code CODE<5:0>. As to initialization of the counting element 501, when the code CODE<5:0> becomes 100110, for example, (that is, when the code value CODE_V is 38), a count termination signal CT38 is activated. When the count termination signal CT38 is activated, the counting element 501 is initialized to the initial value of 0. As another way of initializing the counting element 501, when the self-refresh signal SREF is inactivated to a logic low level, a reset signal RESET is activated to initialize the counting element 501. After the initialization, the code CODE<5:0> is generated in sequence from 000000 to 100110.

Figure 7:
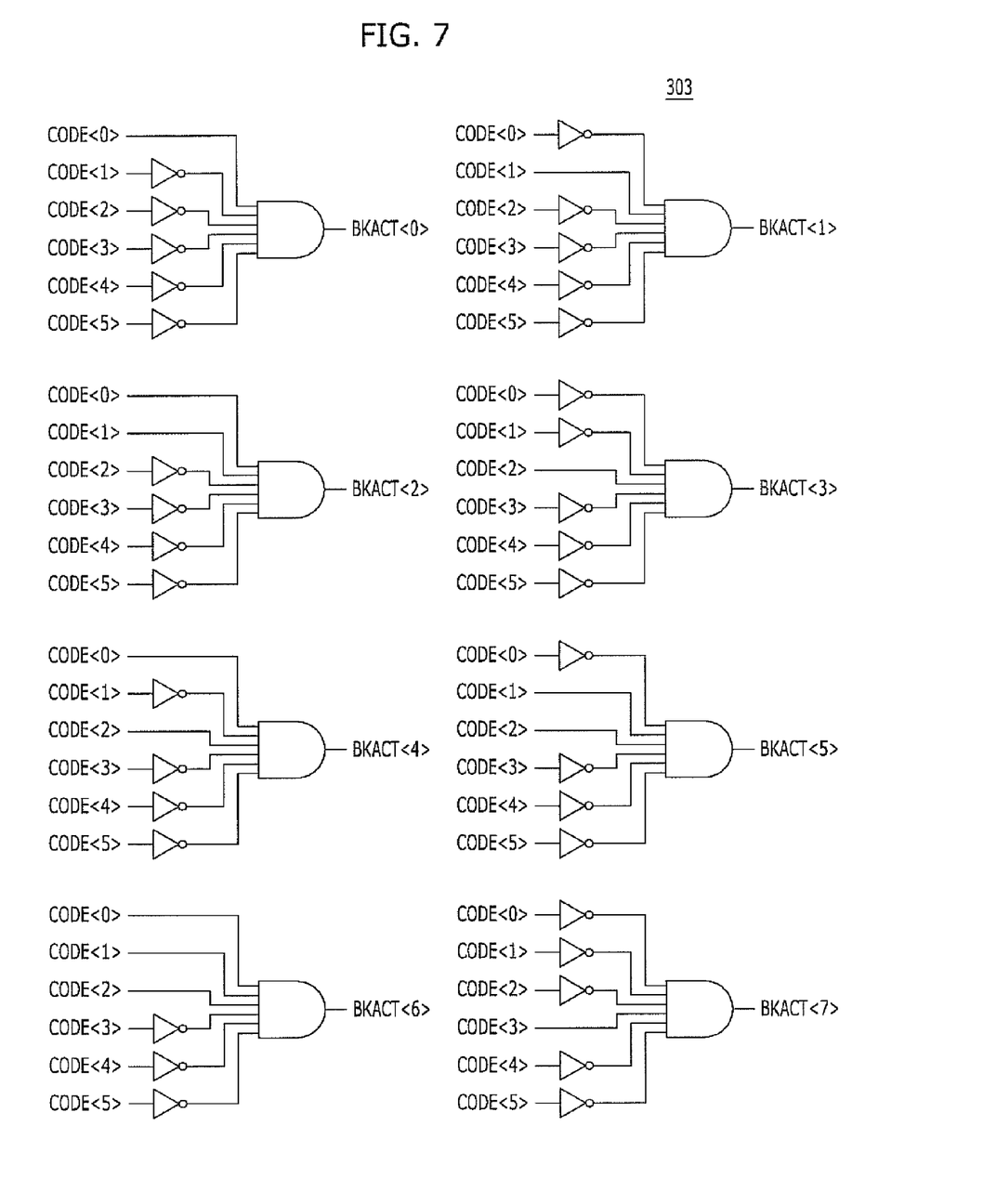
FIG. 7 is an internal circuit diagram of a bank active signal generator 303 shown in FIG. 3.

FIG. 7 is an internal circuit diagram of the bank active signal generator 303 shown in FIG. 3.

In a semiconductor memory devise using the self-refresh control circuit according to an exemplary embodiment of the present invention, when the number of banks in a core region is N, the bank active signal generator 303 may activate N bank active signals BKACT<0> to BKACT<N−1> corresponding to in response to an activation of the code value CODE_V of the generated code CODE<5:0> starting from 1 and ending at N, respectively. Here, the bank active signals BKACT<0> to BKACT<N−1> are sequentially activated depending on timings of when different values of the code CODE<5:0> are activated. As shown in FIG. 3, the N different codes of the code CODE<5:0> may be N codes sequentially generated from the code generator 301.

According to an example, N is 8, and the bank active signal generator 303 may activate 8 bank active signals BKACT<0> to BKACT<7> corresponding to 8 different code values of the code CODE<5:0> starting from 000001 and ending at 000100, respectively. The 8 different code values are sequentially generated from the initial code value after the code generator 301 is initialized. As illustrated in FIG. 7, the bank active signal generator 303 may include a combination of inverters and AND gates.

The code CODE<5:0> corresponds to the activated bank active signals BKACT<0> to BKACT<7> in accordance with Table 1.

TABLE 1

| CODE<5:0> | bank active signal to be activated |
|---|---|
| 000001 | BKACT<0> |
| 000010 | BKACT<1> |
| 000011 | BKACT<2> |
| 000100 | BKACT<3> |
| 000101 | BKACT<4> |
| 000110 | BKACT<5> |
| 000111 | BKACT<6> |
| 001000 | BKACT<7> |

Figure 8:
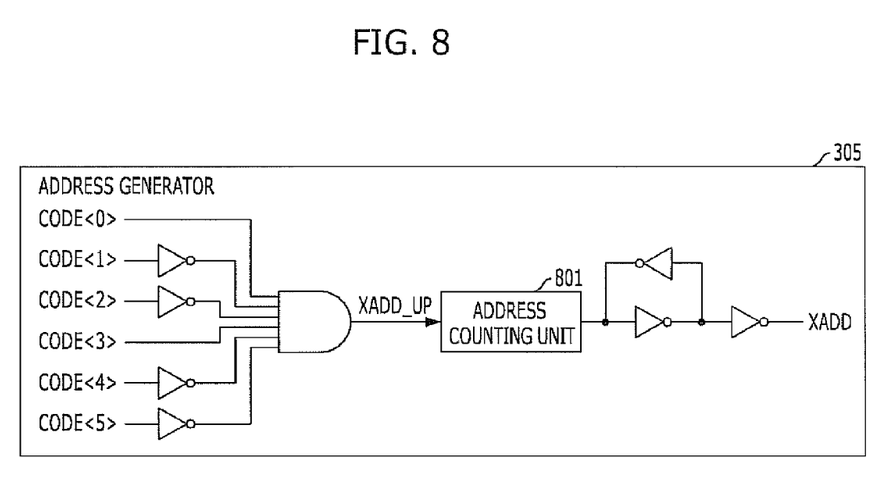
FIG. 8 is an internal circuit diagram of an address generator 305 shown in FIG. 3.

FIG. 8 is an internal circuit diagram of the address generator 305 shown in FIG. 3.

Referring to FIG. 8, the address generator 305 may include an address counting unit 801 for sequentially increasing the row address XADD, where the address generator 305 may change the row address XADD at a certain value greater than the code value CODE_V when the plurality of the bank active signals BKACT<0:7> are all activated.

When the number of banks is 8 according an embodiment of is the present embodiment, the address generator 305 may be designed to increase the row address XADD by 1 after all the 8 bank active signals BKACT<0> to BKACT<7> are activated for the same row address XADD. The address generator 305 activates an address increase signal XADD_UP when the code value CODE_V is 9 (that is, when the code CODE<5:0> becomes 001001). When the address increase signal XADD_UP is activated, the address counting unit 801 sequentially increases the row address XADD and outputs the increased row address XADD. The outputted row address XADD is maintained until the next address increase signal XADD_UP is activated.

Figure 9:
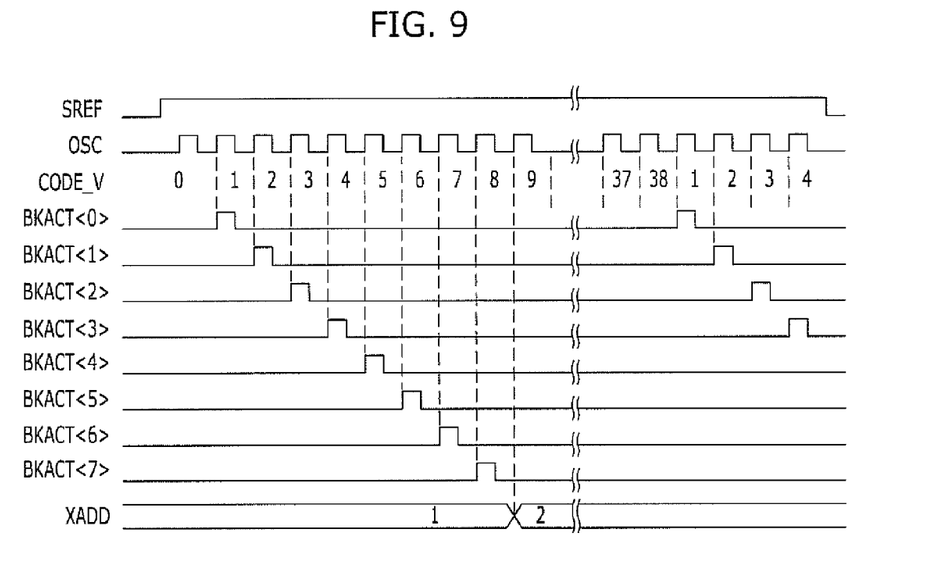
FIG. 9 is a timing diagram of internal signals of the self-refresh control circuit shown in FIG. 3.

FIG. 9 is a timing diagram of internal signals of the self-refresh control circuit shown in FIG. 3.

Referring to FIG. 9, when the self-refresh signal SREF is activated to a logic high level, the periodic wave OSC having a period of approximately 200 ns is generated, and the code CODE<5:0> corresponding to a result of counting the periodic wave OSC is generated at each period of the periodic wave OSC. The count result is output as the code value CODE_V. Since the bank active signals BKACT<0> to BKACT<7> correspond to 8 different codes CODE<5:0> starting from 000001 and ending at 001000, the activation timings of the 8 bank active signals BKACT<0> to BKACT<7> do not overlap with each other.

Figure 10:
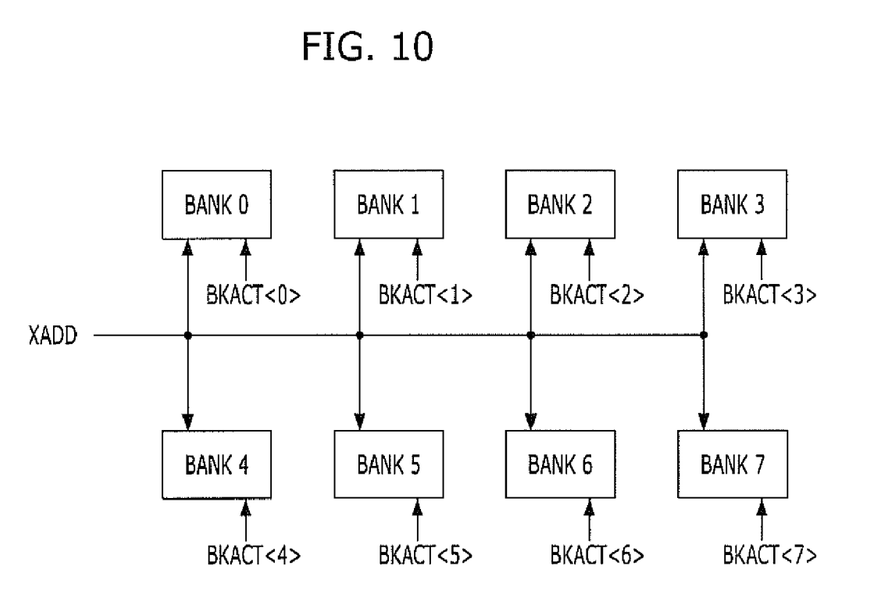
FIG. 10 illustrates a core region including 8 banks BANK0 to BANK7.

FIG. 10 illustrates a core region including 8 banks BANK0 to BANK7.

While 8 banks BANK0 to BANK7 are shown, it's only exemplary and other embodiments of the present invention may include any number of banks including 4 banks and 16 banks.

Referring to FIG. 10, the row address XADD generated in the address generator 305 is transferred to all of the banks BANK0 to BANK7 in the core region. Also, the sequentially activated bank active signals BKACT<0> to BKACT<7> are transferred to the banks BANK0 to BANK7, respectively. The banks BANK0 to BANK7 each activate a word line selected by the row address XADD when the respective one of the bank active signals BKACT<0> to BKACT<7> is activated.

According to one embodiment of the present invention, which is described above, timings of refresh operations for banks are distributed/spread out by generating a code based on a result of counting a periodic wave OSC and decoding the generated code to activate different bank active signals that correspond to different code values, respectively. According to such a method, high peak current in a self-refresh control circuit may be prevented/reduce to enable a stable refresh operation.

While the present invention has been described with respect to the specific embodiments, it will be apparent to those skilled in the art that various changes and modifications may be made without departing from the spirit and scope of the invention as defined in the following claims.

What is claimed is:

1. A self-refresh control circuit, comprising:
    a code generator configured to generate a code by counting periods of a periodic wave based on a self-refresh signal and reset when a code value of the generated code reaches a first value;
    a bank active signal generator configured to generate a plurality of bank active signals sequentially activated in response to different code values of the generated code, respectively, by decoding the generated code; and
    an address generator configured to change a row address after the plurality of the bank active signals are each activated after the reset of the code generator.

2. The self-refresh control circuit of claim 1, wherein the code generator comprises:
    an oscillation unit for receiving the self-refresh signal to generate the periodic wave which toggles at a first period; and
    a counting unit for generating the code which corresponds to a counting result of counting the periods of the periodic wave, and resetting the code value of the generated code to an initial value when the code value reaches the first value.

3. The self-refresh control circuit of claim 1, wherein N is a natural number, the plurality of bank active signals include N bank active signals, and the bank active signal generator activates the N bank active signals respectively corresponding to N different code values of the generated code.

4. The self-refresh control circuit of claim 3, wherein the N bank active signals are each activated when a respective one of the N different code values is generated.

5. The self-refresh control circuit of claim 3, wherein the N different code values are sequentially generated starting from an initial value set when the code generator is reset.

6. The self-refresh control circuit of claim 3, wherein the address generator changes the row address in response to a code value of the generated code higher than the code value of the generated code obtained when the last one of the N bank active signals becomes activated.

7. The self-refresh control circuit of claim 6, wherein the address generator sequentially increases the row address each time that the code value of the generated code reaches has the code value higher than the code value of the generated code.

8. The self-refresh control circuit of claim 1, wherein the address generator comprises:
an address counting unit for sequentially increasing the row address.

9. The self-refresh control circuit of claim 8, wherein the address generator further includes a latch to store a sequentially increased row address output from the address counting unit during an entire period starting from the reset of the code generator and ending at a timing when the last one of the bank active signals is activated.

10. The self-refresh control circuit of claim 1, wherein the code generator is reset at the same time that the address generator changes the row address.

11. A semiconductor memory device, comprising:
a code generator configured to generate a code by counting periods of a periodic wave based on a self-refresh signal and initialize when a code value of the generated code reaches a predetermined value;
a bank active signal generator configured to generate a plurality of bank active signals sequentially activated in response to different code values of the generated code, respectively, by decoding the generated code;
an address generator configured to change a row address after the plurality of the bank active signals are each activated after the reset of the code generator; and
a plurality of banks configured to perform a refresh operation in response to the plurality of the bank active signals and the row address.

12. The semiconductor memory device of claim 11, wherein the code generator comprises:

an oscillation unit for receiving the self-refresh signal to generate the periodic wave which toggles at a first period; and
a counting unit for generating the code which corresponds to a counting result of counting the periods of the periodic wave, and resetting the code value of the generated code to an initial value when the code value reaches the first value.

13. The semiconductor memory device of claim 11, wherein N is a natural number, the plurality of bank active signals include N bank active signals, and the bank active signal generator activates the N bank active signals respectively corresponding to N different code values of the generated code.

14. A method for controlling a self-refresh operation, comprising:
generating a code by counting periods of a periodic wave based on a self-refresh signal;
resetting a code value of the generated code when the code value reaches a first value;
generating a plurality of bank active signals activated in response to different code values of the generated code, respectively, by decoding the generated code; and
changing a row address after the plurality of the bank active signals are each activated after the reset of the code value.

15. The method of claim 14, wherein the generating of the code comprises:
receiving the self-refresh signal to generate the periodic wave which toggles at a first period; and
generating the code which corresponds to a counting result of counting the periods of the periodic wave at the predetermined period.

16. The method of claim 15, wherein the generating of the plurality of the bank active signals comprises:
activating N bank active signals respectively corresponding to N different code values of the generated code, wherein N is a natural number and the plurality of bank active signals include the N bank active signals.

17. The method of claim 16, wherein the N bank active signals are each activated when a respective one of the N different codes is generated.

18. The method of claim 16, wherein the N different code values are sequentially generated starting from an initial value set at the reset of the code value.

19. The method of claim 16, wherein the changing of the row address comprises:
changing the row address in response to a code value of the generated code higher than the code value of the generated code obtained when the last one of the N bank active signals becomes activated.

20. The method of claim 19, wherein the changing of the row address comprises:
sequentially increasing the row address each time that the code value of the generated code has the code value higher than the code value of the generated code.

* * * * *